United States Patent
Sarkar et al.

(10) Patent No.: US 11,632,119 B1
(45) Date of Patent: Apr. 18, 2023

(54) PROGRAMMABLE FRACTIONAL RIPPLE DIVIDER

(71) Applicant: Cadence Design Systems, Inc., San Jose, CA (US)

(72) Inventors: Sudipta Sarkar, San Jose, CA (US); Dimitrios Loizos, Sunnyvale, CA (US); Mehran Mohammadi Izad, San Diego, CA (US); Paul Lee, San Francisco, CA (US); Steven Elliott Mikes, Apex, NC (US); Manohar Bhavsar Nagaraju, San Mateo, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/727,922

(22) Filed: Apr. 25, 2022

(51) Int. Cl.
| H03K 23/00 | (2006.01) |
| H03L 7/197 | (2006.01) |
| H03K 23/66 | (2006.01) |
| H03K 23/58 | (2006.01) |
| H03K 23/48 | (2006.01) |

(52) U.S. Cl.
CPC ......... *H03L 7/1974* (2013.01); *H03K 23/486* (2013.01); *H03K 23/58* (2013.01); *H03K 23/66* (2013.01)

(58) Field of Classification Search
CPC .... H03L 7/1974; H03K 23/486; H03K 23/58; H03K 23/66
See application file for complete search history.

(56) References Cited

U.S. PATENT DOCUMENTS

| 6,501,815 | B1* | 12/2002 | Stansell | H03K 23/667 377/47 |
| 9,859,904 | B1* | 1/2018 | Summers | H03L 7/1976 |
| 10,530,375 | B1* | 1/2020 | Wang | H03L 7/193 |
| 2004/0140831 | A1* | 7/2004 | Wang | H03L 7/1976 327/115 |
| 2015/0200677 | A1* | 7/2015 | Ainspan | H03L 7/1974 327/158 |
| 2018/0054203 | A1* | 2/2018 | Drost | H03K 21/026 |
| 2020/0395961 | A1* | 12/2020 | Perez | H03L 7/099 |

* cited by examiner

*Primary Examiner* — Tuan T Lam
(74) *Attorney, Agent, or Firm* — Mark H. Whittenberger; Holland & Knight LLP

(57) ABSTRACT

Embodiments included herein are directed towards a fractional feedback divider circuit and associated method. The circuit may include a programmable feedback divider including a plurality of flip-flops arranged in series. The programmable feedback divider may be configured to receive an input clock signal and a reset signal comprising at least one pulse and to generate a divided clock. The circuit may include reset logic configured to receive an input from the programmable feedback divider and to generate a reset signal. The circuit may include a first D flip-flop configured to receive the reset signal and to generate an output and a second D flip-flop configured to receive the output from the first D flip-flop and to generate a second output. The circuit may further include a multiplexer configured to receive the second output and to generate an output clock signal.

20 Claims, 14 Drawing Sheets

PROGRAMMABLE FRACTIONAL RIPPLE DIVIDER

FIELD OF THE INVENTION

The present application relates to systems and methods for expanding the number of synthesized frequencies with increased resolution in an integer-N, phase locked loop ("PLL") without the complexities and drawbacks of traditional, fractional-N, PLL by using a programmable, fractional ripple divider.

BACKGROUND

Fractional feedback dividers are utilized in fractional-N, PLL synthesis in order to generate clock out signals that are non-integer (i.e., fractional) multiples of the reference clock inputs, thereby increasing the granularity of synthesized frequencies. Traditionally this is performed by dynamically modulating the feedback divider ratio between N and N+1 such that the averaged divide ratio, over time, is a fractional number between N and N+1. To prevent tones at the voltage controlled oscillator ("VCO") output this modulation is usually done by a delta sigma modulator which causes a higher phase noise at the VCO output.

SUMMARY

In one or more embodiments of the present disclosure, a fractional feedback divider circuit and associated method are provided. The circuit may include a programmable feedback divider including a plurality of flip-flops arranged in series. The programmable feedback divider may be configured to receive an input clock signal and a reset signal comprising at least one pulse and to generate a divided clock by dividing by a rate n or n.5, where n is any integer. The circuit may include reset logic configured to receive an input to reset the programmable feedback divider to a start state that depends on a division ratio. The circuit may include a first D flip-flop configured to receive the reset signal and to generate an output and a second D flip-flop configured to receive the output from the first D flip-flop and to generate a second output. The circuit may further include a multiplexer configured to receive the second output and to generate an output clock signal.

One or more of the following features may be included. In some embodiments, the plurality of flip-flops may include T flip-flops. The circuit may include a latch configured to provide a latch output to the multiplexer. The latch may receive an input from a third D flip-flop. The circuit may further include a second latch configured to provide a second latch output to the multiplexer. The plurality of flip-flops may include five T flip-flops. The circuit may include a first of the plurality of flip-flops may produce a divide-by-two clock. A second of the plurality of flip-flops may produce a divide-by-four clock. The programmable feedback divider may be configured to generate one reset pulse for every n clock cycles. The programmable feedback divider may be configured to divide by any number n and n.5 wherein n is an integer greater than or equal to 3.

In one or more embodiments of the present disclosure a method for fractional feedback dividing is provided. The method may include receiving an input clock signal and a reset signal comprising at least one pulse at a programmable feedback divider including a plurality of flip-flops arranged in series. The method may further include generating a divided clock at the programmable feedback divider. The method may also include receiving a reset signal at a first flip-flop and generating an output at the first flip-flop. The method may further include receiving the output from the first flip-flop at a second flip-flop and generating a second output from the second flip-flop. The method may also include receiving the second output and a latch output at a multiplexer and generating an output clock signal at the multiplexer.

One or more of the following features may be included. In some embodiments, the plurality of flip-flops may include T flip-flops. The first flip-flop and second flip-flop may be D flip-flops. The method may include receiving an input from a third flip-flop at the latch and providing, from a second latch, a second latch output to the multiplexer. The plurality of flip-flops may include five T flip-flops. A first of the plurality of flip-flops may produce a divide-by-two clock. A second of the plurality of flip-flops may produce a divide-by-four clock. The programmable feedback divider may be configured to generate one reset pulse for every n clock cycles. The programmable feedback divider may be configured to divide by any number n and n.5 wherein n is an integer greater than or equal to 3.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
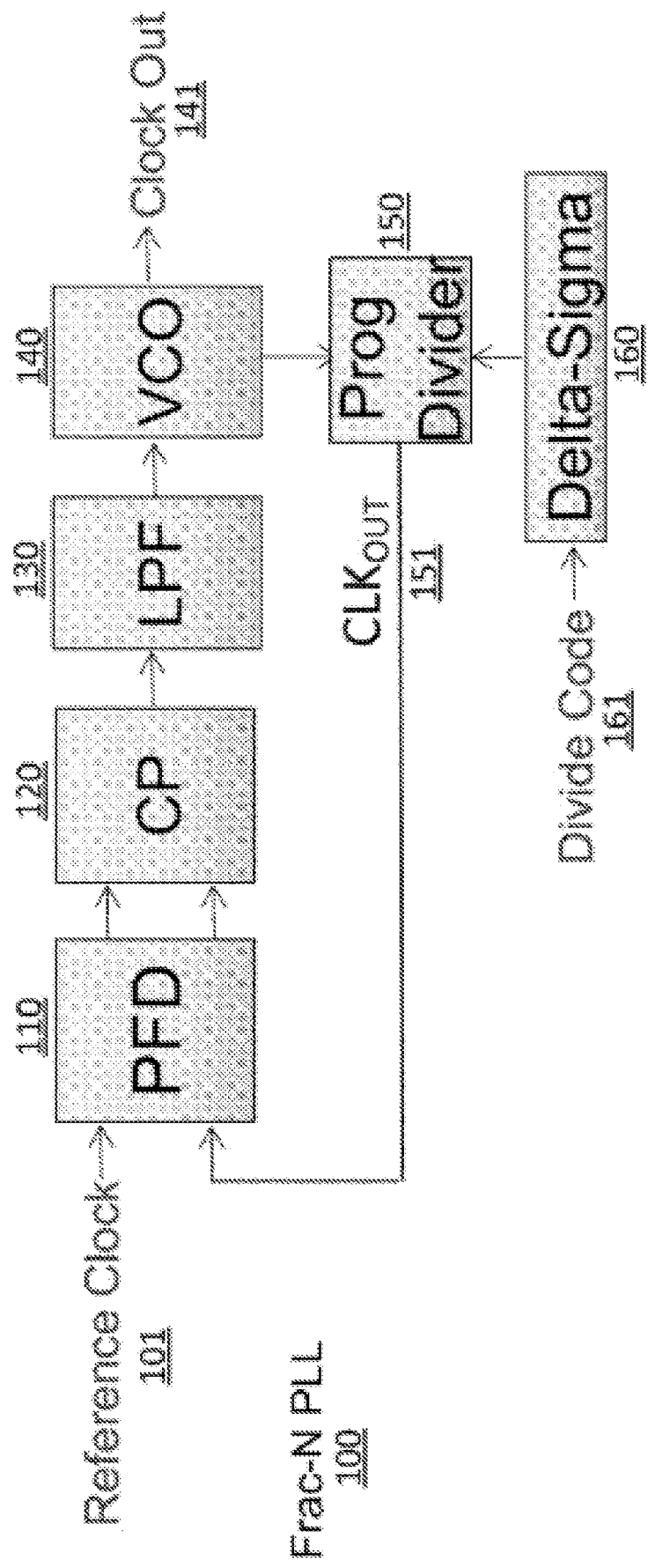
FIG. 1 is a block diagram of an architecture utilized during fractional-N PLL synthesis.

Embodiments of the present disclosure are directed towards a simple, scalable and programmable way to create fractional clocks (specifically n.5 clocks) without the complexity of a traditional fractional N operation. The teachings of the present disclosure may thereby increase the range of synthesized frequencies by a factor of 2. Accordingly, embodiments of the programmable feedback divider described herein may achieve a fixed frequency output as opposed to an on-average one.

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings may denote like elements.

FIG. 1 is a block diagram of an architecture utilized during fractional-N PLL synthesis. As depicted in FIG. 1, the fractional-N PLL synthesis architecture 100 ("frac-N PLL") includes a phase frequency detector ("PFD") 110, a charge pump ("CP") 120, loop filter ("LPF") 130, voltage controlled oscillator ("VCO") 140, a programmable fractional feedback divider ("programmable divider") 150, and a delta-sigma modulator 160. The PFD 110 receives two inputs, a reference clock 101 and a programmable divider clock $CLK_{OUT}$ 151. The PFD 110 compares the phases and frequencies of the reference clock 101 and the programmable divider clock $CLK_{OUT}$ 151. The PFD 101 generates and transmits the phase and frequency differences between clocks 101 and 151 to the CP 120. Based on the polarity of the measured phase and frequency differences, the CP 120 activates either the pump-up or pump-down current source in the charge pump in order to correct the phase and frequency differences. If the pump-up current source is activated, more charge will be transferred to the LPF 130. If the pump-down current source (i.e., current sink) is activated, some charge will be taken away from the LPF 130. The amount of charge in either the pump-up or pump-down scenario is proportional to the magnitude of the phase and frequency differences. The LPF 130 filters and integrates the output current from the CP 120 in order to smooth out the variation in the control voltage of the VCO 140. Therefore, depending on whether the pump-up or the pump-down current source was activated, the LPF 130 adjusts the control voltage of the VCO 140 so that (i) its phase either moves forward or moves back to correct a phase difference and/or (ii) the VCO 140 speeds up or slows down to correct a frequency difference. The VCO 140 also generates an output signal, i.e., clock out 141, whose frequency is proportional to the input voltage from the LPF 130. Clock out 141 is a non-integer multiple of the reference clock 101. The programmable divider 150 divides the clock generated by the VCO 140, i.e., clock 141, by a divide ratio in order to generate a clock, i.e., $CLK_{OUT}$ 151, which matches the frequency of the reference clock 101. Therefore, as a result of the programmable divider 150, the output frequency of clock 141 is equivalent to the frequency of the reference clock 101 multiplied by the divide ratio. The divide ratio of the programmable divider 150 is driven by the delta-sigma modulator 160. The delta-sigma modulator 160 encodes the divide ratio that is sent to the programmable divider 150 based on a received divide code 161. The divide code 161, which corresponds to a desired divide ratio, may be a plurality of bits associated with integer and fractional values. Further, the divide code 161 may be set by either a programmer or a computer processor. The delta-sigma modulator 160 receives the divide code 161, which could be associated with both integer and fractional values, and outputs a divide code 162 (e.g., DIV<N:1>) representing an integer value that, over time, matches the divide code 161 on average. In other words, the output divide code 162 modulates such that the average value, over time, is correct. For example, if the desired divide ratio is 10.5, the output divide code will alternate between values of 10 and 11 such that the average value, over time, is 10.5 (e.g., for one cycle, the delta-sigma modulator 160 outputs a "10," and for the next cycle, it will output an "11"). Further, like the divide code 161, the output divide code 162 may also be represented by a plurality of bits. For example, the output divide code 162, i.e., DIV<N:1>, may include N bits.

Figure 2:
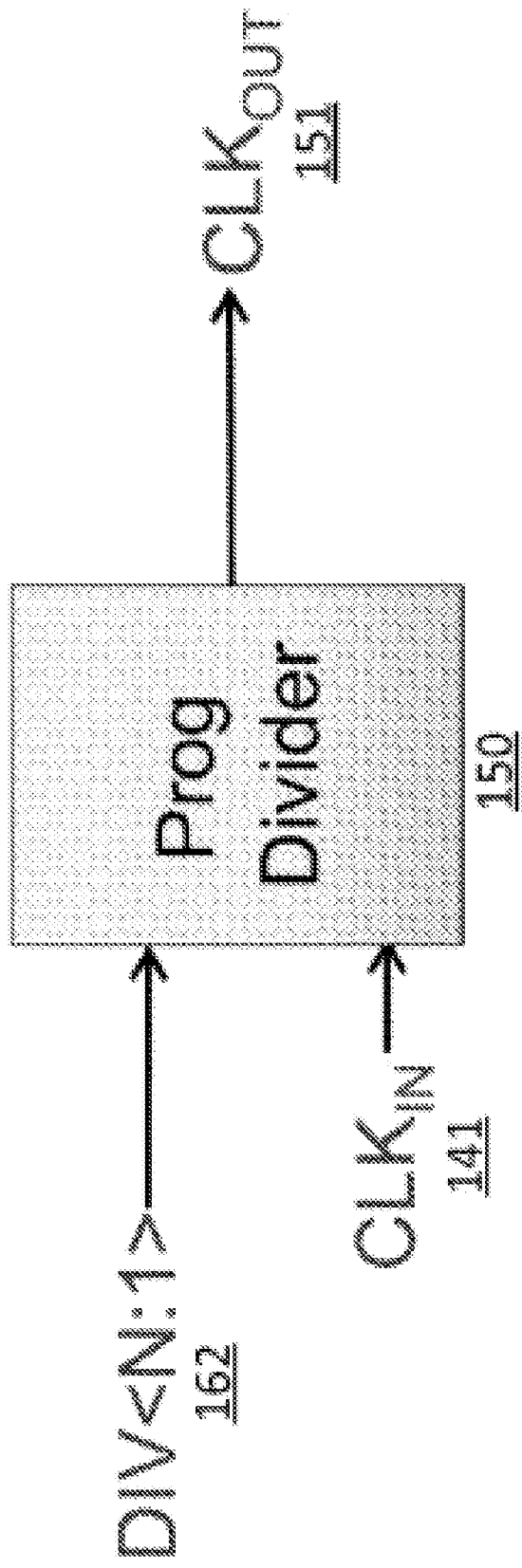
FIG. 2 is a block diagram of the fractional feedback divider utilized in FIG. 1.

FIG. 2 is a block diagram of the fractional feedback divider utilized in FIG. 1. As depicted in FIG. 2, the programmable divider 150 generates a programmable divider clock $CLK_{OUT}$ 151 based on the divide code 162 (i.e., DIV<N:1>) and the input clock $CLK_{IN}$ 141 (which is equivalent to the output clock 141, i.e., Clock Out). Specifically, the programmable divider 150 generates a programmable divider clock 151 that includes a frequency that is equivalent to the frequency of the clock 141 divided by the divide code 162. Further, the divide code 162 can be updated once per each clock cycle of the clock 151. Therefore, the divide code 162 can vary after every clock cycle. This variation in the divide code can be used to generate frequencies at the clock 151 that are in between the integer values of the divide code. For example, the following sequence of the divide codes gives an average value of 10.5: 10, 11, 10, 11 . . . 10, 11. Similarly, for 10.25, it would be 10, 10, 10, 11, 10, 10, 10, 11 . . . 10, 10, 10, 11. Therefore, any pattern can be used to generate arbitrary frequencies. However, as discussed above, the changing divide codes 162 also result in jitter at the clock 151. Specifically, as depicted in the 10.5 pattern, at each clock cycle, the frequency of the clock 151 is running at the wrong frequency. For example, the frequency is too fast (i.e., by a half input clock cycle) when the divide code is 10 and is too slow (i.e., by a half input clock cycle) when the divide code is 11. Additional information surrounding these circuits may be found in U.S.

Pat. No. 9,859,904, available from the Assignee of the subject application, which is hereby incorporated by reference in its entirety.

Figure 3:
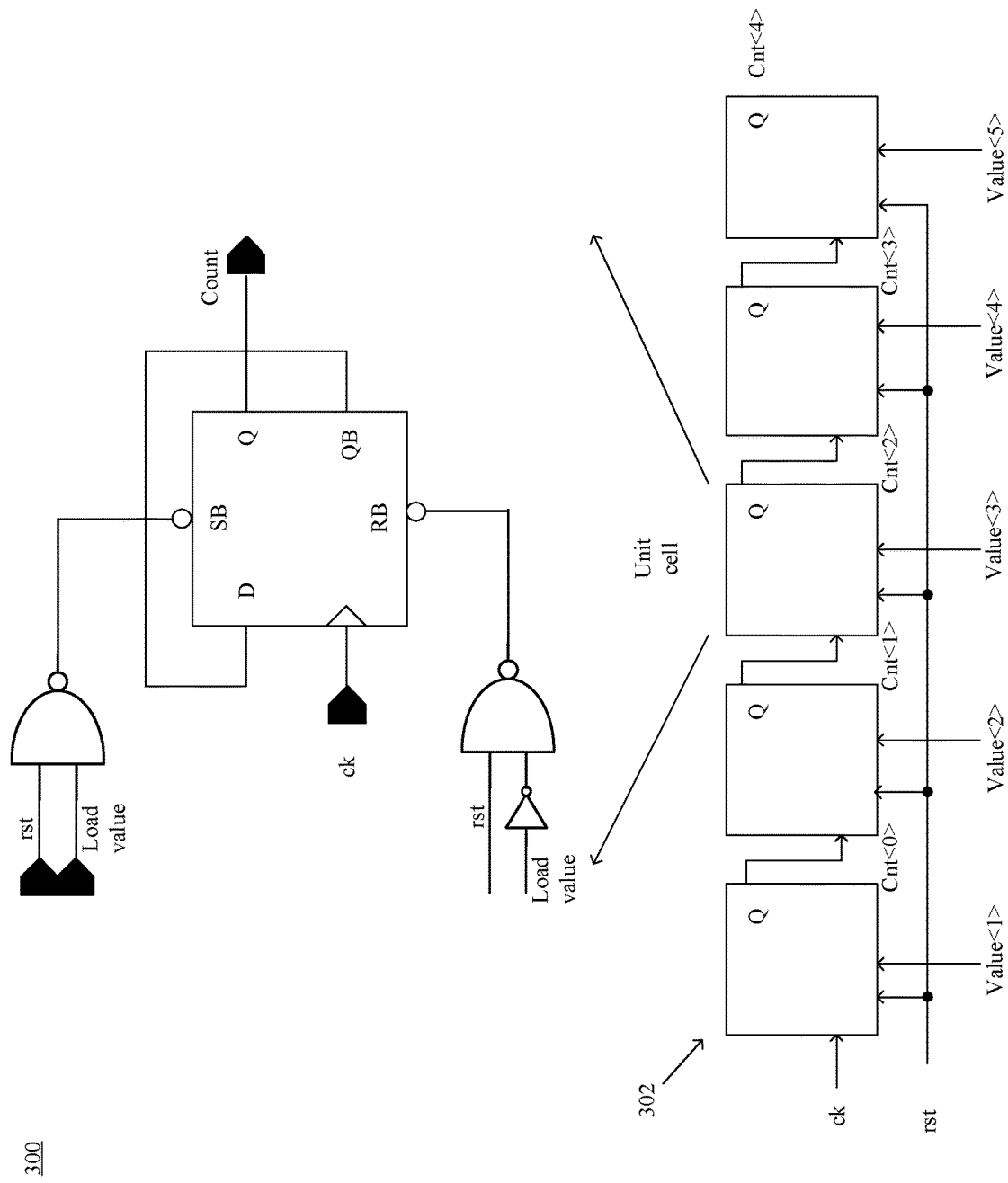
FIG. 3 is an example ripple divider according to an embodiment of the present disclosure.

Referring now to FIG. 3, an embodiment showing the basic structure of a ripple divider 300 is provided. Embodiments of the present disclosure are directed towards a programmable ripple divider capable of dividing by any rate n and n.5, where n is any integer >=3.

Figure 4:
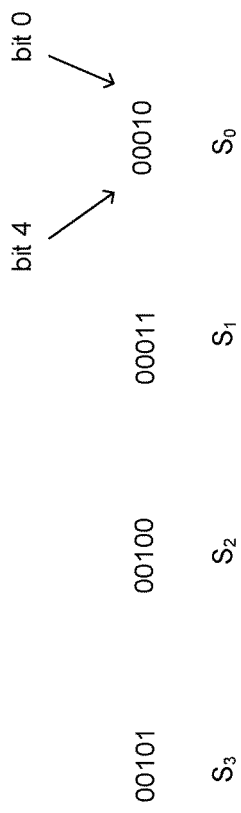
FIG. 4 is an example showing various states according to an embodiment of the present disclosure.
Figure 5:
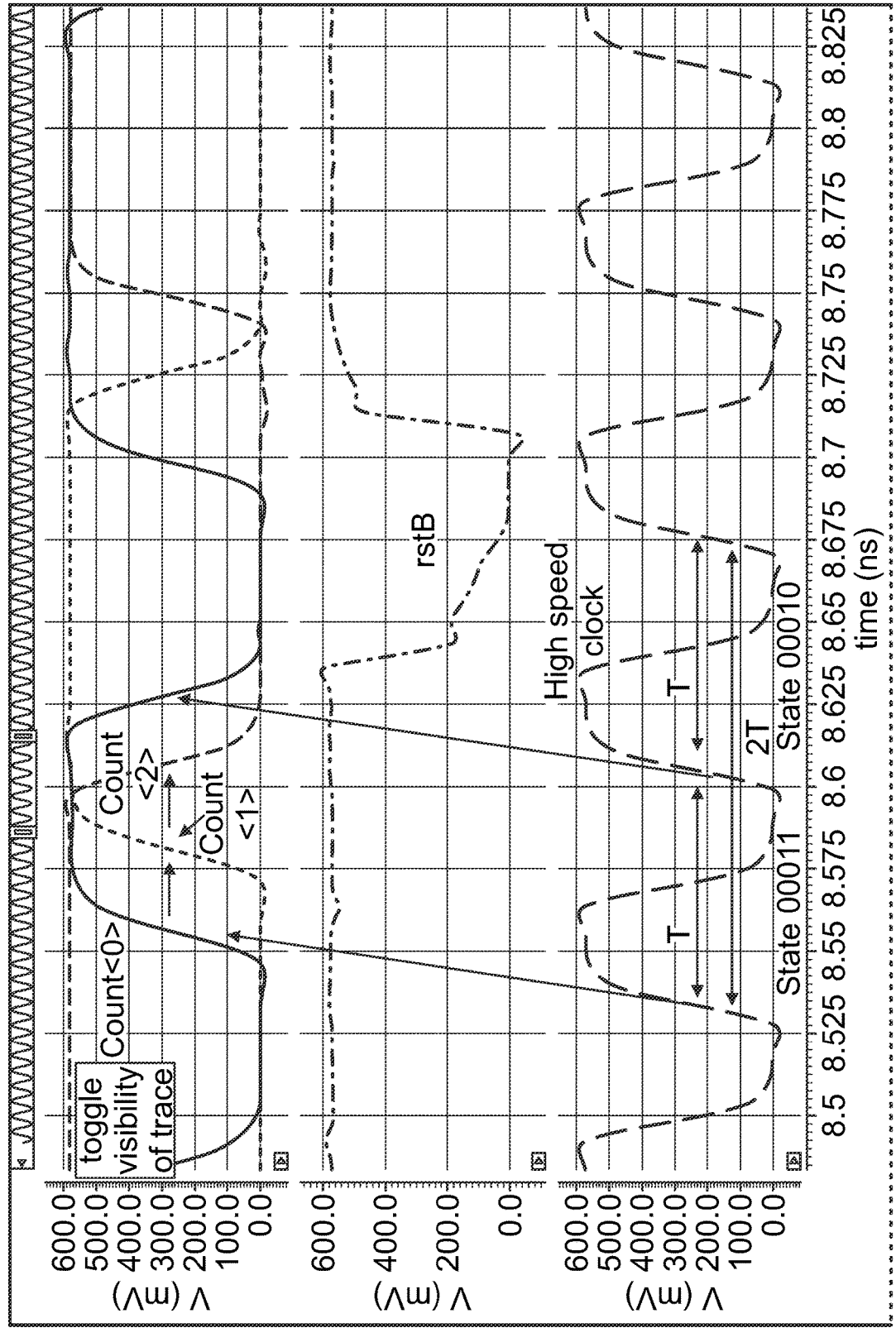
FIG. 5 is an example timing diagram according to an embodiment of the present disclosure.

In some embodiments, divider 300 may be arranged using back to back T flip flops 302 as shown in FIG. 3. The advantage of using a ripple divider as opposed to a synchronous divider is that the clock load may be minimized, since the high-speed clock only drives one flop for the least significant bit ("LSB"). Although this technique is valid for any n>=3, this particular example is restricted to n<=31. The first stage (left most) T flip-flop may receive the high-speed clock as an input and produce a divide-by-2 clock cnt<0> which may be used by the second T flip-flop to produce a divide-by-4 clock cnt<1>, etc. The ripple divider may be reset to a state value <5:1> at the end of the counting period and may count down to 1 from that state. The end of the counting period may be detected and value<5:1> may be loaded onto the ripple counter again and the process continues. As such the ripple counter divides by value <5:1>. Since the counter is asynchronous, cnt<0> may be generated after one tclock-to-q ("tcq"), cnt<1> may be generated after two tcqs and cnt<4> may be generated after 5 tcqs. In a high-speed system, usually at most 2 tcqs fit in one clock period (which means 2*tcq+set-up time ("tsu")<T, where T is the clock period). This indicates that cnt<4> can't be resampled by the original high-speed clock. As such, not all counter states can be properly detected. Accordingly, the state may need to be set correctly (to create the periodic reset pulse) so that timing requirements are met. Since this is a count-down timer, in the example shown in FIG. 4, a state close to 1(00001) may be selected and a reset pulse may be created. The timing requirements for choosing to detect state 00010 are shown in FIG. 4. This figure indicates that from $S_1$ to $S_0$ only bit 0 flips, meaning there is only one $t_{cq}$. Accordingly, it may be necessary to fit in one $t_{cq}$, logic delay for detection and one tsu into one clock cycle. From $S_2$ to $S_0$, bit 2 flips, so $3t_{cq}s$, $t_{logic}$ and $t_{su}$ must fit into 2 clock cycles. This is shown in Equations 1 and 2 provided below and a timing diagram is provided in FIG. 5:

$$T_{cq}+t_{logic.b0}+t_{su}<T \qquad \text{Equation 1}$$

$$3T_{cq}+t_{logic.b2}+t_{su}<2T \qquad \text{Equation 2}$$

Figure 6:
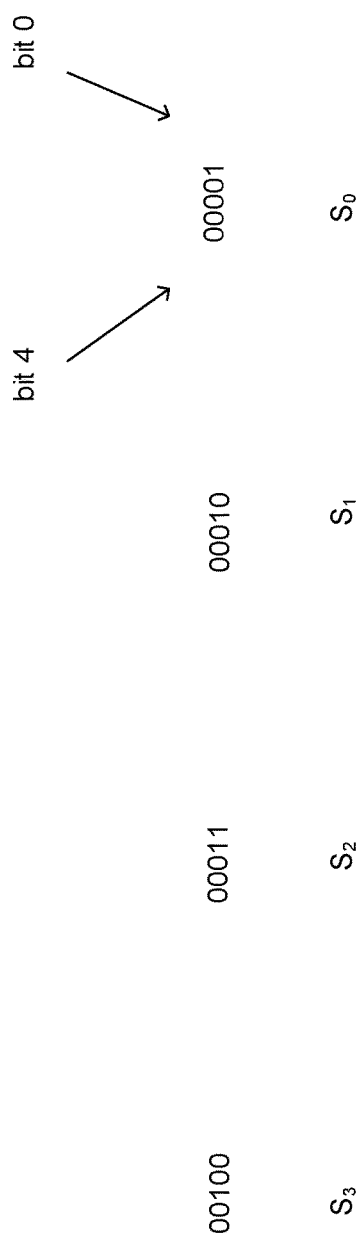
FIG. 6 is an example showing various states according to an embodiment of the present disclosure.

In operation, when a state to detect is selected, these checks may be carried out for each bit (e.g., analyzing the timing from the last state when it flipped), and determining that timing is met. For choosing the state 00010 it turns out that Equation (1) and Equation (2) provide similar constraints (for a particular process and choice of clock frequency), and both of them need to be met with some margin. Another consideration in choosing the state to detect is that the minimum value that may be counted is one more than the chosen state. If we choose to detect state 2 (00010) the minimum value that may be counted is 3, which indicates that the minimum division ratio is 3. The process may then attempt to detect the state 1 (instead of 2) as shown in FIG. 6. In reviewing the $S_1$-$S_0$ transition, both bit 1 and bit 0 need to flip, as shown in Equation 3 provided below:

$$2T_{cq}+t_{logic.b1}+t_{su}<T \qquad \text{Equation 3}$$

Figure 7:
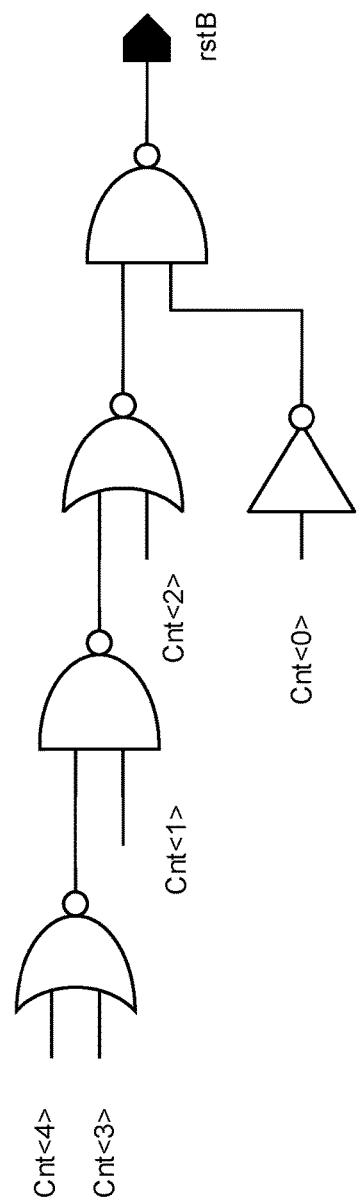
FIG. 7 is an example showing reset logic according to an embodiment of the present disclosure.

Referring now to FIG. 7, an embodiment showing example reset logic is provided. This particular example shows example reset logic consisting of a series of NAND and NOR gates that may be configured to generate the rst signal for the ripple counter. Reset logic 700 may be configured to order the bits in order they arrive. For example, in detecting state 00010, the bits <2> and <0> arrive latest, so they may be positioned closest to the output.

Figure 8:
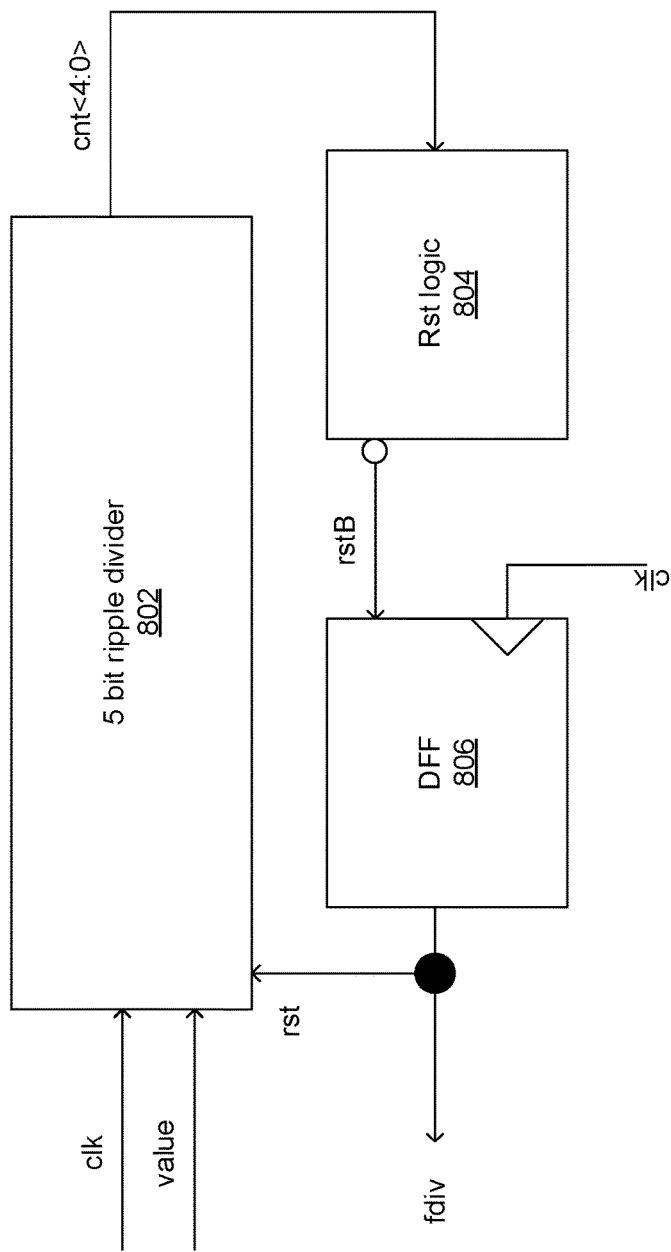
FIG. 8 is an example any rate counter according to an embodiment of the present disclosure.

Referring now to FIG. 8, an embodiment showing one possible example divider 800 is provided. Divider 800 may include divider 802, reset logic 804, and one or more flip-flops 806. In some embodiments, the ripple divider may be configured to generate the n.5 division ratios, where n is any integer from 3 to 31. In one example, all sequential logic may be configured to operate at both edges of the clock. However, this may create difficult timing constraints, since T needs to be replaced by T/2 in equations 1-2. Also, each flip-flop needs to be dual edge triggered, which requires doubling of the flip-flop area.

Figure 9:
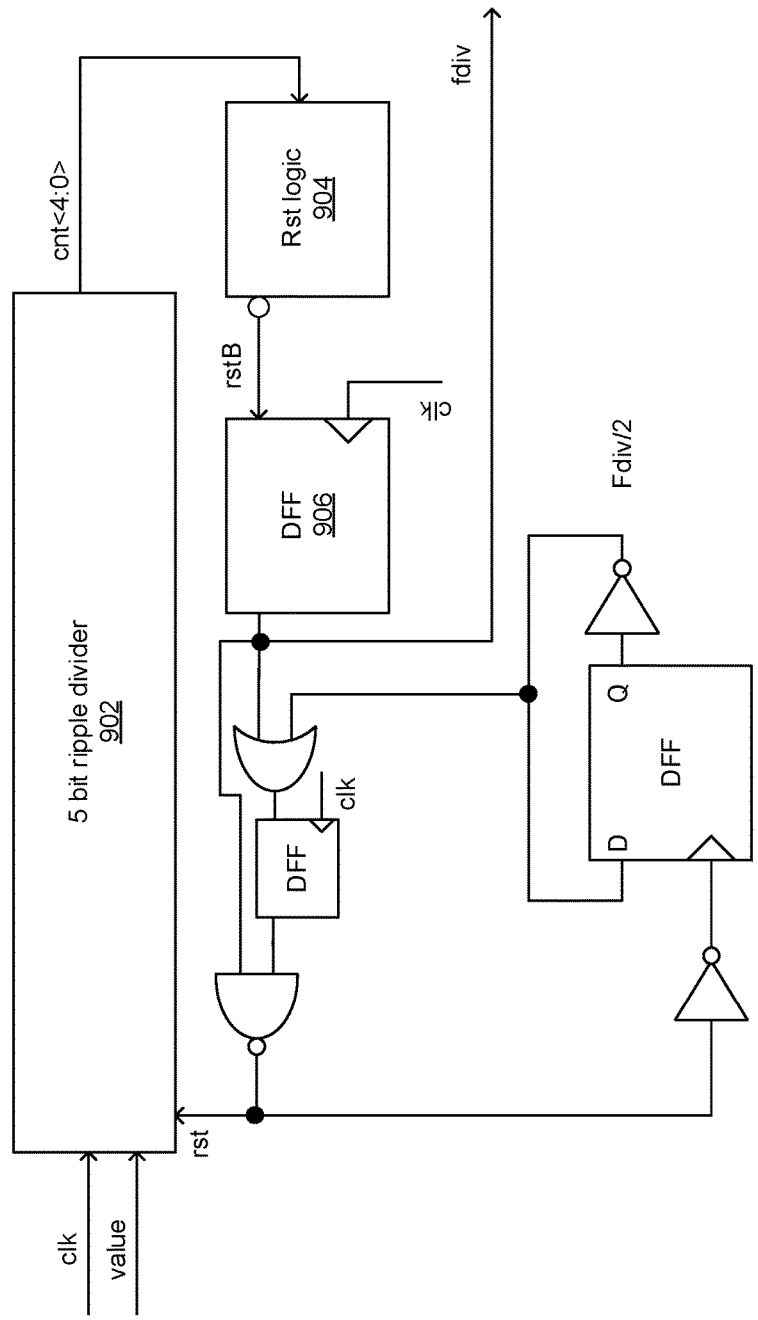
FIG. 9 is an example circuit according to an embodiment of the present disclosure.

In some embodiments, alternatively, if we divide by n and n+1 in successive cycles, on average, there would be a division by n.5, however the generated clock will have a strong component at fdiv/2, which is undesirable. In order to divide successively by n/n+1, embodiments included herein may stretch the reset pulse by one clock cycle, every other fdiv clock cycle. This may be achieved using the logic shown in FIG. 9. The signals rst, fdiv, and clk waveforms are shown in FIG. 10 where n=3.

Figure 10:
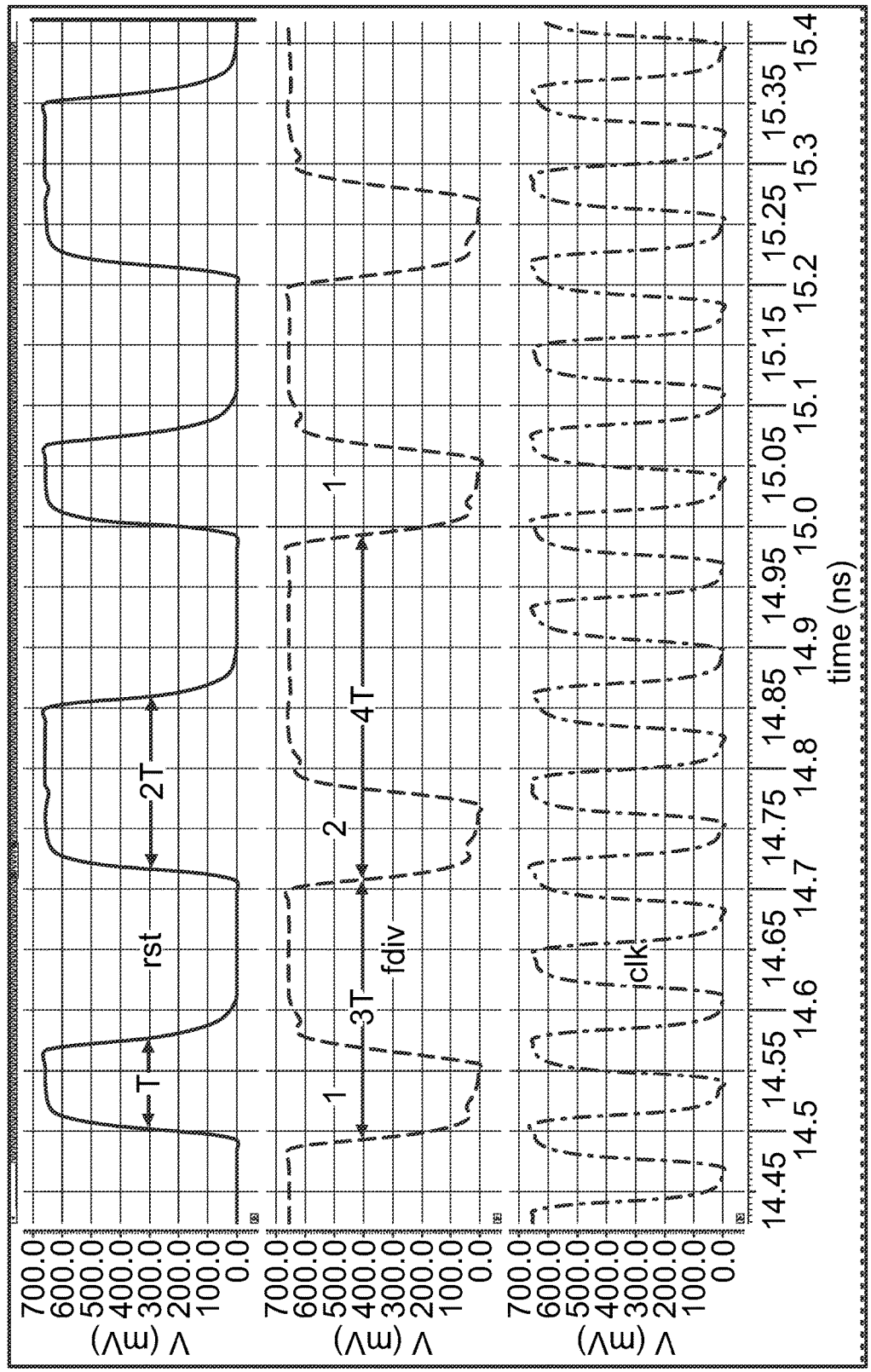
FIG. 10 is an example timing diagram according to an embodiment of the present disclosure.

In the example of FIG. 10, the period of fdiv may alternate between 3 and 4 clock cycles of the high-speed clock. If we look at fdiv waveform, we see that if we delay the $2^{nd}$ pulse by half a clock cycle and leave $1^{st}$ pulse untouched we will get the division by 3.5. Two cycles of fdiv happens in 7 cycles of clk. This may be achieved by a multiplexer that alternately selects between A and B (=A delayed by half clock cycle of high-speed clock) as shown in the final circuit of FIG. 11. The associated waveforms are displayed in FIG. 12. In this example, the division ratio is value<5:0>/2. The loads at point A and B need to be balanced to minimize deterministic jitter on the fractional clocks. The deterministic jitter on the fractional clocks will be non-negligible if the high-speed clock duty cycle deviates from 50%. If the duty cycle of the high-speed clock is close to 50%, the deterministic jitter of the divided (fractional) clock is close to zero and duty cycle and time period are nearly constant from cycle to cycle. Since the frequency of this deterministic jitter is Fdiv/2=Fref/2 of PLL, it further gets filtered by the loop filter of the integer-N PLL. When value<0>=0, we have the integer division ratios, the mux selection for MUX is 1 and the signal at point A is passed through. Since value<0>=0, FdivBy2 stays at zero.

Figure 11:
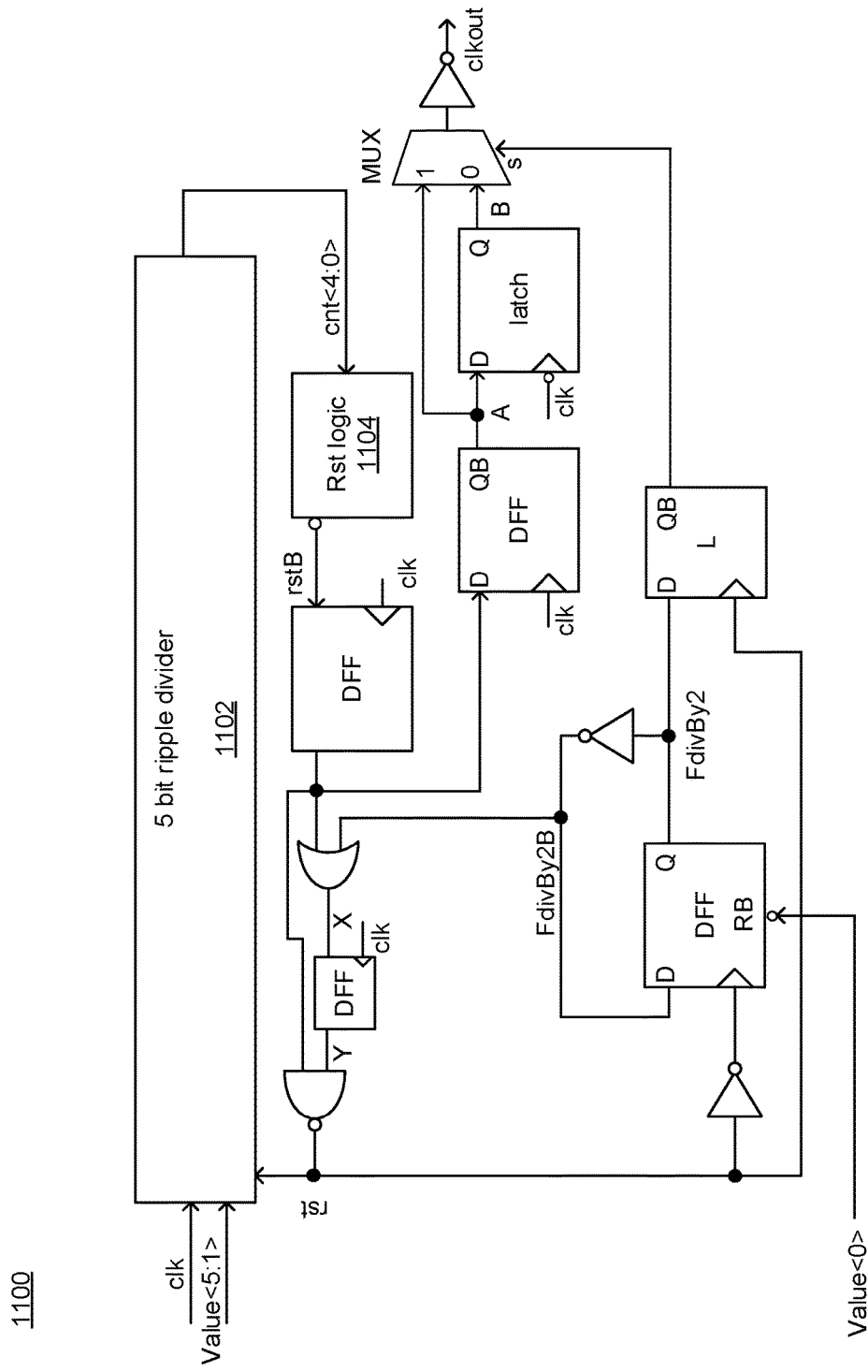
FIG. 11 is an example circuit according to an embodiment of the present disclosure.
Figure 12:
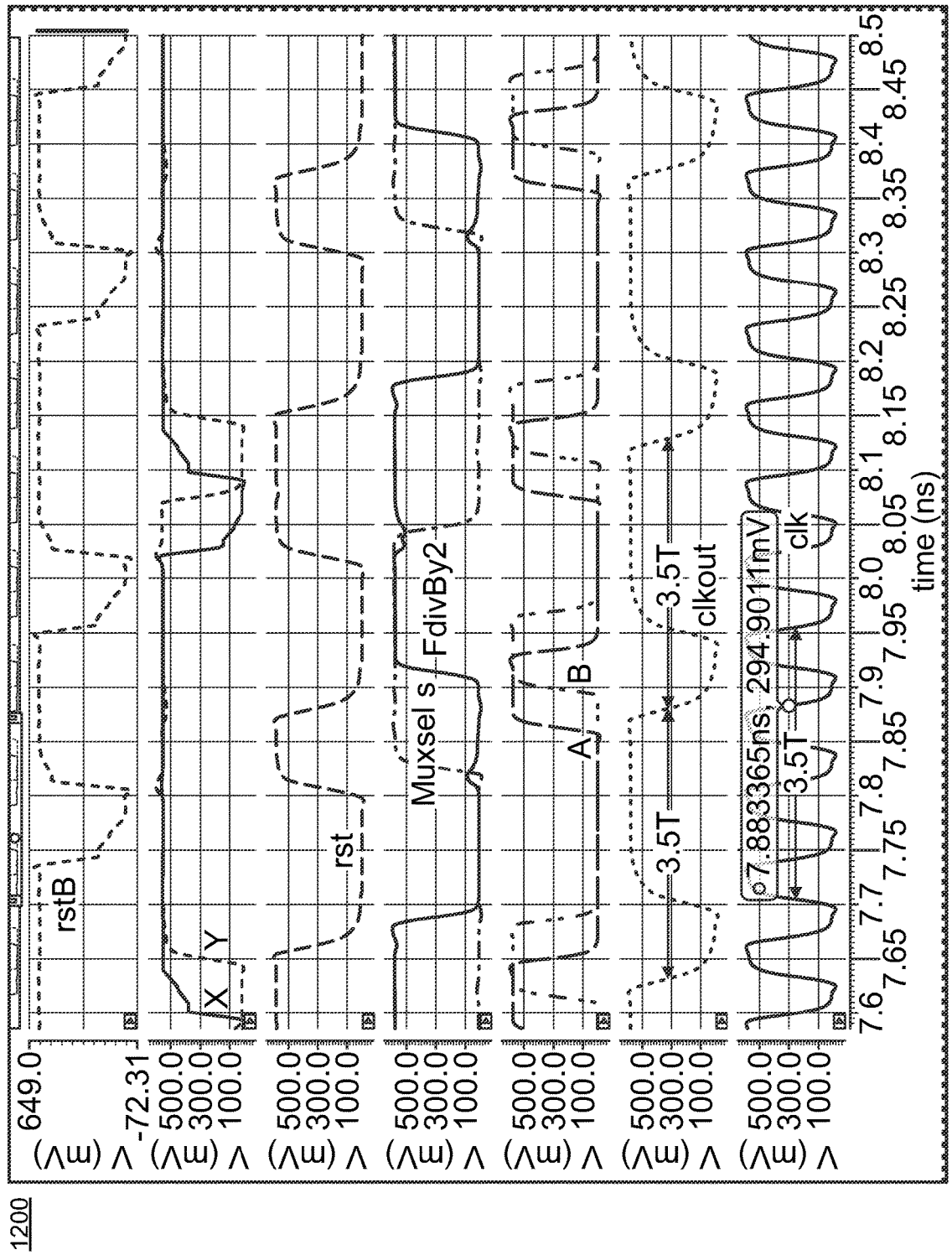
FIG. 12 is an example waveform according to an embodiments of the present disclosure.
Figure 13:
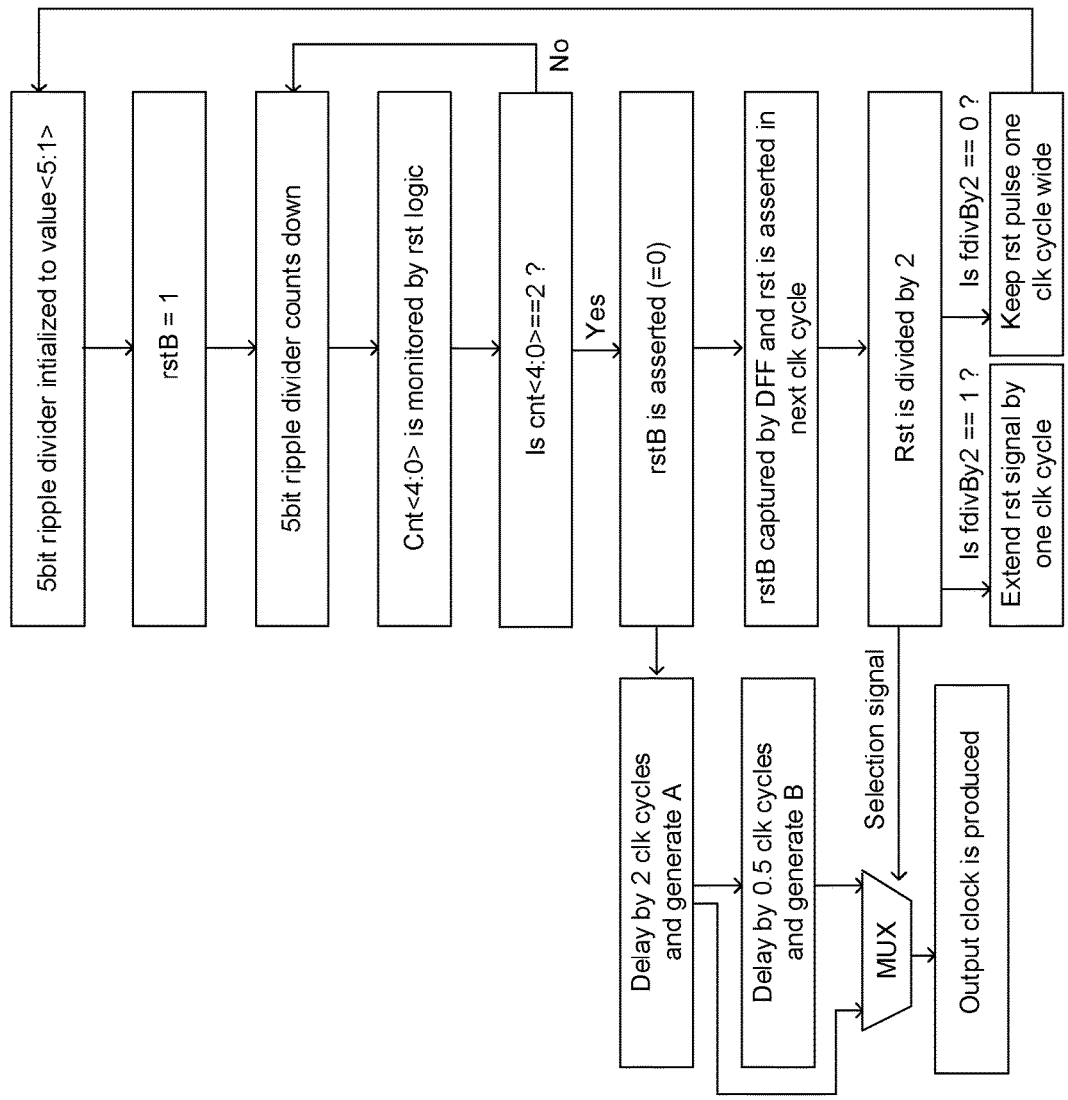
FIGS. 13-14 show exemplary flowcharts according to embodiments of the present disclosure.

Referring now to FIGS. 11 and 13, an example method consistent with embodiments of the present disclosure is provided. In operation, the 5 bit ripple divider/counter 1102 may be configured to receive a high speed clock and a reset signal. The counter may be configured to count down from a programmable value value<5:1>. When the reset signal is asserted, value<5:1> may be written onto the ripple counter 1102, and after the reset signal is de-asserted, counter 1102 may count down from that value. The state of the counter cnt<4:0> may be continuously monitored by rst logic 1104 and when cnt<4:0> reaches 00010, rstB is asserted by the rst logic. The rstB signal may be retimed by the high speed clk and the rst signal may be asserted and ripple counter 1102 may be reset again to value<5:1> and this process may continue. This results in a division by value<5:1>=n. The rst signal may be further divided by 2 and the fdivBy2 signal may be generated. When FdivBy2 is asserted, the rst pulse may be extended by one clock cycle of the high speed clock and this may result in a division by value<5:1>+1=n+1. As a result, ripple counter 1102 may alternately divides by n and n+1. rstB may be retimed by clk and clkB signals to generate A and B signals. B may be a delayed version of A and the delay amount may be a half clock cycle of the high speed clk. A multiplexer "mux" selection signal "s" may be derived from FdivBy2 which selects between A and B in an alternating fashion which may combine appropriate edges of A and B to generate a final clkout with a division factor n.5. The period of clkout is n.5*Tclk, where Tclk is the time period of the high speed clk.

Figure 14:
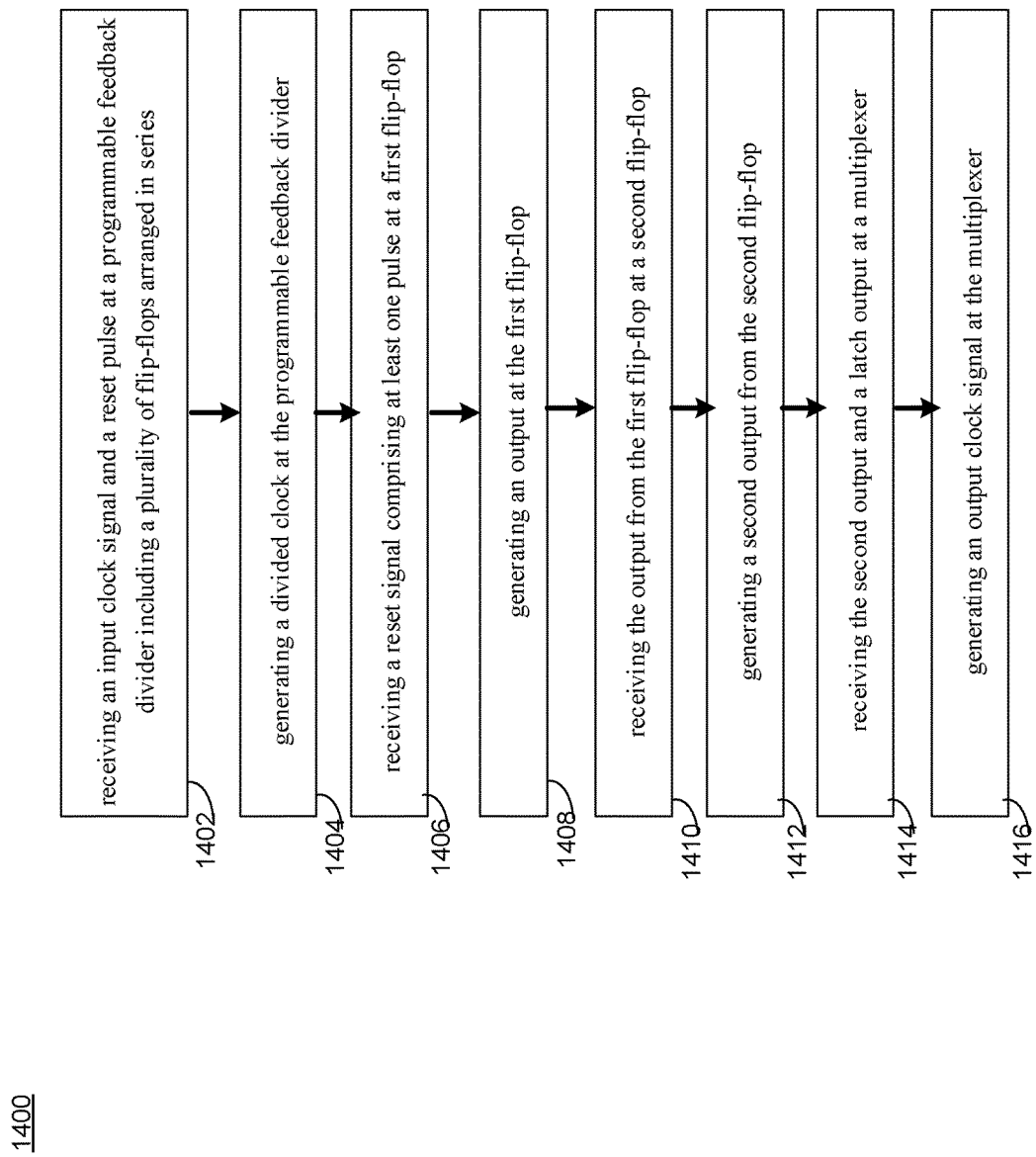

Referring now to FIG. 14, an example method for fractional feedback (n.5) division is provided. The method may include receiving 1402 an input clock signal and a reset signal comprising at least one pulse at a programmable feedback divider including a plurality of flip-flops arranged in series. The method may further include generating 1404 a divided clock at the programmable feedback divider. The method may also include receiving 1406 a reset signal at a first flip-flop and generating 1408 an output at the first flip-flop. The method may further include receiving 1410 the output from the first flip-flop at a second flip-flop and generating 1412 a second output from the second flip-flop. The method may also include receiving 1414 the second output and a latch output at a multiplexer and generating 1416 an output clock signal at the multiplexer. Numerous other operations are also within the scope of the present disclosure as discussed hereinabove.

In some embodiments, the programmable feedback divider may be configured to receive an input clock signal and a divide ratio value and to generate a divided clock by dividing by a rate n or n.5, where n is any integer. The circuit may include reset logic configured to detect the state of a counter and to reset the programmable feedback divider to a start state that depends on a division ratio. The circuit may include a first D flip-flop configured to receive the reset signal and to generate an output and a second D flip-flop configured to receive the output from the first D flip-flop and to generate a second output. The second output may be provided to a latch that would generate a third output. The circuit may further include a multiplexer configured to receive the second and third outputs and to generate an output clock signal. The circuit's divided output frequency is a fixed ratio of its input frequency as opposed to an on-average one, which is the case in other fractional divider implementations.

Embodiments included herein provide numerous advantages over existing approaches. One programmable circuit may be used to divide by any number n and n.5, where n is any integer >=3. Although the circuits provided herein restrict n<=31, it should be noted that the teachings of the present disclosure may be extended to any practically feasible number.

It will be apparent to those skilled in the art that various modifications and variations can be made in the embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A fractional feedback divider circuit comprising:
    a programmable feedback divider including a plurality of flip-flops arranged in series, the programmable feedback divider configured to receive an input clock signal and a reset signal comprising at least one pulse, the programmable feedback divider configured to generate a divided clock by dividing by a rate n or n.5, where n is any integer;
    reset logic configured to receive an input to reset the programmable feedback divider to a start state that depends on a division ratio;
    a first D flip-flop configured to receive the reset signal and to generate an output;
    a second D flip-flop configured to receive the output from the first D flip-flop and to generate a second output; and
    a multiplexer configured to receive the second output and to generate an output clock signal.

2. The fractional feedback divider circuit of claim 1, wherein the plurality of flip-flops include T flip-flops.

3. The fractional feedback divider circuit of claim 1, further comprising:
    a latch configured to provide a latch output to the multiplexer.

4. The fractional feedback divider circuit of claim 3, wherein the latch receives an input from a third D flip-flop.

5. The fractional feedback divider circuit of claim 3, further comprising:
    a second latch configured to provide a second latch output to the multiplexer.

6. The fractional feedback divider circuit of claim 2, wherein the plurality of flip-flops include five T flip-flops.

7. The fractional feedback divider circuit claim 2, wherein a first of the plurality of flip-flops produces a divide-by-two clock.

8. The fractional feedback divider circuit of claim 7, wherein a second of the plurality of flip-flops produces a divide-by-four clock.

9. The fractional feedback divider circuit claim 1, wherein the programmable feedback divider is configured to generate one reset pulse for every n clock cycles.

10. The fractional feedback divider circuit of claim 1, wherein the programmable feedback divider is configured to divide by any number n and n.5 wherein n is an integer greater than or equal to 3.

11. A fractional feedback divider method comprising:
    receiving an input clock signal and a reset pulse at a programmable feedback divider including a plurality of flip-flops arranged in series;
    generating a divided clock at the programmable feedback divider;
    receiving a reset signal comprising at least one pulse at a first flip-flop;
    generating an output at the first flip-flop;
    receiving the output from the first flip-flop at a second flip-flop;
    generating a second output from the second flip-flop;
    receiving the second output and a latch output at a multiplexer; and
    generating an output clock signal at the multiplexer.

12. The fractional feedback divider method of claim 11, wherein the plurality of flip-flops include T flip-flops.

13. The fractional feedback divider method of claim 11, wherein the first flip-flop and second flip-flop are D flip-flops.

14. The fractional feedback divider method of claim 13, further comprising:
    receiving an input from a third flip-flop at the latch.

15. The fractional feedback divider method of claim 13, further comprising:
    providing, from a second latch, a second latch output to the multiplexer.

16. The fractional feedback divider method of claim 12, wherein the plurality of flip-flops include five T flip-flops.

17. The fractional feedback divider method claim 12, wherein a first of the plurality of flip-flops produces a divide-by-two clock.

18. The fractional feedback divider method of claim 17, wherein a second of the plurality of flip-flops produces a divide-by-four clock.

19. The fractional feedback divider method claim 11, wherein the programmable feedback divider is configured to generate one reset pulse for every n clock cycles.

20. The fractional feedback divider method of claim 11, wherein the programmable feedback divider is configured to divide by any number n and n.5 wherein n is an integer greater than or equal to 3.

\* \* \* \* \*